United States Patent
Kim et al.

(10) Patent No.: US 9,654,139 B2
(45) Date of Patent: *May 16, 2017

(54) HIGH THROUGHPUT BINARIZATION (HTB) METHOD FOR CABAC IN HEVC

(75) Inventors: Seung-Hwan Kim, Vancouver, WA (US); Kiran Misra, Vancouver, WA (US); Louis Joseph Kerofsky, Camas, WA (US); Christopher A. Segall, Camas, WA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 527 days.

This patent is subject to a terminal disclaimer.

(21) Appl. No.: 13/354,272

(22) Filed: Jan. 19, 2012

(65) Prior Publication Data

US 2013/0188734 A1    Jul. 25, 2013

(51) Int. Cl.
| | |
|---|---|
| *H04N 11/02* | (2006.01) |
| *H03M 7/40* | (2006.01) |
| *H04N 19/13* | (2014.01) |
| *H04N 19/91* | (2014.01) |
| *H04N 19/21* | (2014.01) |

(52) U.S. Cl.
CPC .......... *H03M 7/4018* (2013.01); *H04N 19/13* (2014.11); *H04N 19/21* (2014.11); *H04N 19/91* (2014.11)

(58) Field of Classification Search
None
See application file for complete search history.

(56) References Cited

U.S. PATENT DOCUMENTS

| | | | |
|---|---|---|---|
| 5,793,897 | A | 8/1998 | Jo et al. |
| 5,982,437 | A | 11/1999 | Okazaki et al. |
| 6,646,578 | B1 | 11/2003 | Au |
| 6,658,167 | B1 | 12/2003 | Lee |
| 7,088,271 | B2 | 8/2006 | Marpe |

(Continued)

FOREIGN PATENT DOCUMENTS

| | | |
|---|---|---|
| AU | 2013206815 A1 | 3/2015 |
| AU | 2016200057 A1 | 1/2016 |

(Continued)

OTHER PUBLICATIONS

Single entropy coder for HEVC with a high throughput binarization mode, Nov. 28, 2011, Lainema et al.*

(Continued)

*Primary Examiner* — James M Anderson, II
(74) *Attorney, Agent, or Firm* — Leydig, Voit & Mayer, Ltd.

(57) ABSTRACT

Provided is an electronic device configured for high throughput binarization mode. The electronic device includes a processor and instructions stored in memory that is in electronic communication with the processor. The electronic device obtains a block of transformed and quantized coefficients (TCQs). The electronic device determines whether a high throughput binarization mode condition is met. If the condition is met, the electronic device uses the high throughput binarization mode to process the block. If the condition is not met, the electronic device does not use the high throughput binarization mode to process the block. The electronic device transmits the generated first or second bitstream to a decoder.

6 Claims, 10 Drawing Sheets

| sign | Abs (coefficient[i]) | Input |
|---|---|---|
| + | 1 | 0 |
| - | 1 | 1 |
| + | 2 | 2 |
| - | 2 | 3 |
| + | 3 | 4 |
| - | 3 | 5 |
| + | 4 | 6 |
| - | 4 | 7 |
| ... | ... | ... |

Mapping Table for Input Value
input = (abs (coefficient[i]) -1)<<1 + sign (sign +:0, -:1)

(56) References Cited

U.S. PATENT DOCUMENTS

| | | | |
|---|---|---|---|
| 7,167,988 B2 | 1/2007 | Hayashi | |
| 7,286,710 B2 | 10/2007 | Marpe | |
| 7,369,066 B1 | 5/2008 | Benzreba | |
| 7,385,535 B2 | 6/2008 | Yang et al. | |
| 7,508,328 B2 | 3/2009 | Gong | |
| RE40,782 E | 6/2009 | Jo et al. | |
| 7,580,328 B2 | 8/2009 | Lee | |
| 7,991,610 B2 | 8/2011 | Sperschneider | |
| 8,046,214 B2 | 10/2011 | Mehrotra | |
| 8,180,915 B2 | 5/2012 | Zhao | |
| 8,249,883 B2 | 8/2012 | Mehrotra | |
| 8,401,321 B2 | 3/2013 | Lee | |
| 8,552,890 B2 | 10/2013 | Kim | |
| 8,923,406 B2 | 12/2014 | Mark et al. | |
| 2002/0114397 A1 | 8/2002 | Todo et al. | |
| 2005/0249289 A1 | 11/2005 | Yagasaki et al. | |
| 2006/0017592 A1 | 1/2006 | Shim et al. | |
| 2006/0104530 A1 | 5/2006 | Smirnov | |
| 2007/0009047 A1 | 1/2007 | Shim | |
| 2007/0121728 A1 | 5/2007 | Wang et al. | |
| 2008/0165844 A1 | 7/2008 | Karczewicz | |
| 2008/0225955 A1 | 9/2008 | Ridge et al. | |
| 2009/0002379 A1 | 1/2009 | Baeza et al. | |
| 2009/0087111 A1 | 4/2009 | Noda et al. | |
| 2009/0096643 A1 | 4/2009 | Chang et al. | |
| 2010/0134330 A1 | 6/2010 | Sakaguchi | |
| 2010/0141485 A1 | 6/2010 | Kadono et al. | |
| 2011/0243232 A1 | 10/2011 | Alshina et al. | |
| 2012/0082215 A1* | 4/2012 | Sze et al. | 375/240.03 |
| 2012/0082230 A1 | 4/2012 | Karczewicz et al. | |
| 2012/0099646 A1 | 4/2012 | Coban et al. | |
| 2012/0121011 A1 | 5/2012 | Coban et al. | |
| 2012/0140814 A1* | 6/2012 | Sole Rojals | H03M 7/4018 375/240.02 |
| 2012/0183052 A1 | 7/2012 | Lou et al. | |
| 2013/0003858 A1 | 1/2013 | Sze | |
| 2013/0051475 A1 | 2/2013 | Joshi et al. | |
| 2013/0058407 A1 | 3/2013 | Sole Rojals et al. | |
| 2013/0114676 A1 | 5/2013 | Guo et al. | |
| 2013/0114684 A1 | 5/2013 | Kim | |
| 2013/0114687 A1 | 5/2013 | Kim | |
| 2013/0128949 A1* | 5/2013 | Sezer et al. | 375/240.02 |
| 2013/0177069 A1* | 7/2013 | Sze et al. | 375/240.02 |
| 2013/0187796 A1 | 7/2013 | Kim | |
| 2013/0187797 A1 | 7/2013 | Kim | |
| 2013/0188683 A1 | 7/2013 | Kim | |
| 2013/0188734 A1 | 7/2013 | Kim et al. | |
| 2013/0188736 A1 | 7/2013 | Kim | |
| 2013/0223521 A1 | 8/2013 | Kim | |
| 2013/0294524 A1 | 11/2013 | Van Der Auwera et al. | |
| 2013/0301738 A1 | 11/2013 | Kim et al. | |
| 2013/0343448 A1 | 12/2013 | He et al. | |
| 2014/0146894 A1 | 5/2014 | Yu et al. | |
| 2015/0016542 A1 | 1/2015 | Rosewarne et al. | |
| 2015/0110180 A1 | 4/2015 | An et al. | |
| 2015/0271518 A1 | 9/2015 | Sato et al. | |
| 2015/0326883 A1 | 11/2015 | Rosewarne | |
| 2016/0044313 A1 | 2/2016 | Yagasaki et al. | |

FOREIGN PATENT DOCUMENTS

| | | |
|---|---|---|
| CN | 1650636 A | 8/2005 |
| CN | 1695168 A | 11/2005 |
| CN | 1725859 A | 1/2006 |
| GB | 2492333 A | 1/2013 |
| JP | H05347710 A | 12/1993 |
| KR | 20040031949 A | 4/2004 |
| WO | WO 2013001279 a2 | 1/2013 |
| WO | WO 2013108639 A1 | 7/2013 |

OTHER PUBLICATIONS

Joint Collaborative Team on video Coding (JCT-VC) of ITU-T SG16 WP3 and ISO/IEC JTC1/SC29/WG11; Title: "AhG8: Simplified Update of the Coefficient Level Rice Parameter"; Authors: Joel Sole and Marta Karczewicz; 13th Meeting: Incheon, KR; Apr. 18-26, 2013; 4 pages.

Joint Collaborative Team on Video Coding (JCT-VC) of ITU-T SG16 WP3 and ISO/IEC JTC1/SC29/WG11; Title: "Non-RCE1/Non-RCE2: Simplified Level Coding for Transform Skip and Lossless Coding"; Authors: Seung-Hwan Kim and Andrew Segall; 13th Meeting: Incheon, KR; Apr. 18-26, 2013; 10 pages.

Joint Collaborative Team on Video Coding (JCT-VC) of ITU-T SG16 WP3 and ISO/IEC JTC1/SC29/WG11; Title: "AHG8: Coefficient Level cRiceParam Updates for Screen Content Coding"; Author: Madhukar Budagavi; 13th Meeting: Incheon, KR; Apr. 18-26, 2013; 6 pages.

Joint Collaborative Team on Video Coding (JCT-VC) of ITU-T SG16 WP3 and ISO/IEC JTC1/SC29/WG11, "WD5: Working Draft 5 of High-Efficiency Video Coding", 7th Meeting: Geneva, CH, Nov. 21-30, 2011; Version 4—Jan. 9, 2012.

Stolowitz Ford Cowger LLC, listing of related cases, Jan. 19, 2012.

Joint Collaborative Team on video Coding (JCT-VC) of ITU-T SG16 WP3 and ISO/IEC JTC1/SC29/WG11; Title: "WD4: Working Draft 4 of High-Efficiency Video Coding"; Authors: Benjamin Bross, Woo-Jin Han, Jens-Rainer Ohm, Gary J. Sullivan and Thomas Wiegand; 6th Meeting: Torino, IT; Jul. 14-22, 2011; 235 pages.

Joint Collaborative Team on Video Coding (JCT-VC) of ITU-T SG16 WP3 and ISO/ISC JTC1/SC29/WG11; Title: "Single entropy coder for HEVC with a high throughput binarization mode"; Authors: Jani Lainema, Kemal Ugur and Antti Hallapuro; 7th Meeting: Geneva, CH; Nov. 21-30, 2011; 9 pages.

International Searching Authority; International Search Report dated Apr. 23, 2013 for PCT/JP2013/000242; 4 pages.

Stolowitz Ford Cowger LLC, listing of related cases, Jan. 30, 2012.

Bross, Benjamin, et al.; "WD4: Working Draft 4 of High-Efficiency Video Coding"; Joint Collaborative Team on Video Coding (JCT-VC); Working Draft of HEVC; Document No. JCTVC-F803; Torino, IT; Jul. 14-22, 2011; 235 pages.

Bossen, Frank; "Common Test Conditions and Software Reference Configurations"; Joint Collaborative Team on Video Coding (JCT-VC); Meeting Output Document; Document No.; JCTVC-F900; Torino, IT; Jul. 14-22, 2011; 3 pages.

Benjamin Bross et al., "High Efficiency Video Coding (HEVC) text specification draft 10 (for FDIS & Last Call)", Joint Collaborative Team on Video Coding (JCT-VC) of ITU-T SG16 WP3 and ISO/IEC JTC1/SC29/WG11 JCTVC-L1003 v34, ITU-T, Mar. 19, 2013, pp. 52, 142-143.

Office Action issued on Apr. 4, 2014 for copending U.S. Appl. No. 13/365,215.

Final Office Action issued on Nov. 20, 2014 for copending U.S. Appl. No. 13/365,215.

Office Action issued on Dec. 5, 2014 for copending U.S. Appl. No. 13/457,272.

Advisory Action issued on Mar. 12, 2015 in copending U.S. Appl. No. 13/365,215.

Office Action issued on Aug. 13, 2015, in copending U.S. Appl. No. 13/857,366.

Piao et al., "Reduced chroma contexts for significance map coding in CABAC," Joint Collaborative Team on Video Coding (JCT-VC) of ITU-T SG16 WP3 and ISO/IEC JTC1/SC29/WG11, 7th Meeting, Geneva, Switzerland, Document JCTVC-G781 (Nov. 21-30, 2011).

Kim et al., "Non-CE1: High Throughput Binzarization (HTB) method with modified level coding," Joint Collaborative Team on Video Coding (JCT-VC) of ITU-T SG16 WP3 and ISO/IEC JTC1/SC29/WG11, 8th Meeting, San Jose, California, Document JCTVC-H0510 (Feb. 1-10, 2012).

"Series H: Audiovisual and Multimedia Systems; Infrastructure of audiovisual services—Coding of moving video; Advanced video coding for generic audiovisual services," Recommendation ITU-T H.264, pp. i-661, International Telecommunication Union, Geneva, Switzerland (Jun. 2011).

Office Action issued on Sep. 4, 2015, in copending U.S. Appl. No. 13/942,616.

(56) References Cited

OTHER PUBLICATIONS

Office Action issued on Sep. 24, 2015, in copending U.S. Appl. No. 13/365,215.
Office Action issued on May 1, 2015 against co-pending U.S. Appl. No. 13/457,272.
3rd Office Action in corresponding U.S. Appl. No. 13/857,366 (Jul. 11, 2016).
2nd Office Action in corresponding U.S. Appl. No. 13/942,616 (Apr. 6, 2016).
Joint Collaborative Team on Video Coding (JCT-VC) of ITU-T SG16 WP3 and ISO/IEC JTC1/SC29/WG11, "WD5: Working Draft 5 of High Efficiency Video Coding," 7th Meeting: Geneva, CH, Nov. 21-30, 2011; Version 4—Jan. 9, 2012; 215 pages.
Stolowitz Ford Cowger LLP; Listing of Related Cases dated Sep. 9, 2013; 2 pages.
Stolowitz Ford Cowger LLP; Listing of Related Cases (May 13, 2013).
Restriction Requirement for co-pending U.S. Appl. No. 13/365,215 dated Sep. 24, 2015.
Lainema et al.; Single Entropy coder for HEVC with a High Throughput Binarization Mode; Preview document JCTVC-G569 for Geneva Meeting (MPEG No. m22133); Nov. 28, 201; 237 pages.
Stolowitz Ford Cowger LLP; Listing of Related Cases dated Mar. 4, 2014; 2 pages.
Stolowitz Ford Cowger LLC; Listing of Related Cases (Feb. 2, 2012).
Stolowitz Ford Cowger LLC; Listing of Related Cases (Jan. 27, 2012).
Flynn et al., "High Efficiency Video Coding (HEVC) Range Extensions text specification: Draft 2 (for PDAM)," Joint Collaborative Team on Video Coding (JCT-VC) of ITU-T SG 16 Wp 3 and ISO/IEC JTC 1/SC 29/WG 11, 12th Meeting, Geneva, Switzerland, pp. i-306, Document JCTVC-L1005_v4 (Jan. 14-23, 2013).
Sharman et al., "AHG5: Range Extensions and High Bit Depths," Joint Collaborative Team on Video Coding (JCT-VC) of ITU-T SG 16 WP 3 and ISO/IEC JTC 1/SC 29/WG 11, 13th Meeting, Incheon, Korea, pp. 1-20, Document JCTVC-M0178 (Apr. 18-26, 2013).
Kim et al., "AHG18: Modified scaling factor for transform-skip blocks to support higher bit depths greater than equal to 14," Joint Collaborative Team on Video Coding (JCT-VC) of ITU-T SG 16 WP 3 and ISO/IEC JTC 1/SC 29/WG 11, 14th Meeting, Vienna, Austria, pp. 1-3, Document JCTVC-N0275, WG11 Doc m29926 (Jul. 25-Aug. 2, 2013).
Sharman et al., "AHG5: Unifying DPCM," Joint Collaborative Team on Video Coding (JCT-VC) of ITU-T SG 16 WP 3 and ISO/IEC JTC 1/SC 29/WG 11, 15th Meeting, Geneva, Switzerland, pp. 1-10, Document JCTVC-O0066 (Oct. 23-Nov. 1, 2013).
Pourazad et al., "HEVC: The New Gold Standard for Video Compression," IEEE Consumer Electronics Magazine, pp. 36-46, Institute of Electrical and Electronics Engineers, New York, New York (Jul. 2012).
3rd Office Action in corresponding U.S. Appl. No. 13/942,616 (Oct. 12, 2016).
Extended European Search Report dated Jul. 6, 2015, for European Application No. 13738029.1.
Kim et al., "Improved CABAC for lossless compression", Joint Collaborative Team on Video Coding (JCT-VC) of ITU-T SG 16 WP 3 AND ISO/IEC JTC 1/SC 29/WG 11, JCTVC-I0341, XP-30112104, 9th Meeting, Apr. 27-May 7, 2012, 5 pgs.
Kim et al., "Simplified CABAC for lossless compression", Joint Collaborative Team on Video Coding (JCT-VC) of ITU-T SG-16 WP3 and ISO/IEC JTC1/SC29/WG11, JCTVC-H0499, XP-30051905, 8th Meeting, Feb. 1-10, 2012 (Presented at MPEG Meeting on Feb. 6-10, 2012), 8 pgs.
Kim et al., "Simplified CABAC for lossless compression", Joint Collaborative Team on Video Coding (JCT-VC) of ITU-T SG-16 WP3 and ISO/IEC JTC1/SC29/WG11, JCTVC-H0499, XP-30111526, 8th Meeting, Feb. 1-10, 2012, 5 pgs.
Korodi et al., "Encoding and decoding significant coefficient flags for small Transform Units using partition sets" Joint Collaborative Team on Video Coding (JCT-VC) of ITU-T SG16 WP3 and ISO/IEC JTC1/SC29/WG11, 7th Meeting, JCTVC-G657, XP-30110641, Nov. 21-30, 2011, 14 pgs.
U.S. Appl. No. 13/360,615, filed Jan. 27, 2012.
U.S. Appl. No. 13/444,710, filed Apr. 11, 2012.
U.S. Appl. No. 15/080,079, filed Mar. 24, 2016.
U.S. Appl. No. 14/997,361, filed Jan. 15, 2016.
Office Action in corresponding Japanese Patent Application No. 2014-534694 (Nov. 15, 2016).
Office Action in corresponding Chinese Patent Application No. 201280005986.5 (Nov. 11, 2016).

\* cited by examiner (background)

| Scanning Position | 0 | 1 | 2 | 3 | 4 | 5 | 6 | 7 | ... |
|---|---|---|---|---|---|---|---|---|---|
| Coefficient Level | 4 | 0 | 3 | -3 | 2 | 1 | 0 | -1 | ... |
| 1. Last_position_X |  |  |  |  |  |  |  | 2 |  |
| Last_position_Y |  |  |  |  |  |  |  | 1 |  |
| 2. Significance Map | 1 | 0 | 1 | 1 | 1 | 1 | 0 |  |  |
| 3. Greater_than_1 | 1 |  | 1 | 1 | 1 | 0 |  | 0 |  |
| Greater_than_2 | 1 |  | 1 | 1 | 0 |  |  |  |  |
| Sign Information | + |  | + | - | + | + |  | - |  |
| Absolute - 3 | 1 |  | 0 | 0 |  |  |  |  |  |

\* Coefficients are coded in reverse scanning order (background)

(background)

Decoder processing using high throughput binarization mode

| sign | Abs (coefficient[i]) | Input |
|---|---|---|
| + | 1 | 0 |
| - | 1 | 1 |
| + | 2 | 2 |
| - | 2 | 3 |
| + | 3 | 4 |
| - | 3 | 5 |
| + | 4 | 6 |
| - | 4 | 7 |
| ... | ... | ... |

Mapping Table for Input Value input = (abs (coefficient[i]) -1)<<1 + sign (sign +:0, -:1)

FIG. 9

| Input value | Codeword (VLC-Table0) | Codeword (VLC-Table1) | Codeword (VLC-Table2) | Codeword (VLC-Table3) | Codeword (VLC-Table4) |
|---|---|---|---|---|---|
| 0 | 1 | 10 | 100 | 1000 | 10000 |
| 1 | 01 | 11 | 101 | 1001 | 10001 |
| 2 | 001 | 010 | 110 | 1010 | 10010 |
| 3 | 0001 | 011 | 111 | 1011 | 10011 |
| 4 | 00001 | 0010 | 0100 | 1100 | 10100 |
| 5 | 000001 | 0011 | 0101 | 1101 | 10101 |
| 6 | 0000001 | 00010 | 0110 | 1110 | 10110 |
| 7 | 00000001 | 00011 | 0111 | 1111 | 10111 |
| 8 | 000000001 | 000010 | 00100 | 01000 | 11000 |
| 9 | 0000000001 | 000011 | 00101 | 01001 | 11001 |
| 10 | 00000000100 | 0000010 | 00110 | 01010 | 11010 |
| 11 | 00000000101 | 0000011 | 00111 | 01011 | 11011 |
| 12 | 00000000110 | 00000010 | 000100 | 01100 | 11100 |
| ... | ... | ... | ... | ... | ... | if (input > (Table[vlc]) ) vlc + +;
where Table[VLC] = {3,5,13,27};
'vlc' represents the current vlc table number and stop 'vlc' table updating when vlc is equal to 4

FIG. 10

HIGH THROUGHPUT BINARIZATION (HTB) METHOD FOR CABAC IN HEVC

TECHNICAL FIELD

The present disclosure relates generally to electronic devices. More specifically, the present disclosure relates to electronic devices utilizing enhanced Context Adaptive Binary Arithmetic Coding (CABAC) for encoding and/or decoding.

BACKGROUND

Many decoders (and encoders) receive (and encoders provide) encoded data for blocks of an image. Typically, the image is divided into blocks and each of the blocks is encoded in some manner, such as using a discrete cosine transform (DCT), and provided to the decoder. The decoder receives the encoded blocks and decodes each of the blocks in some manner, such as using an inverse discrete cosine transform.

Video coding standards, such as MPEG-4 part 10 (H.264), compress video data for transmission over a channel with limited frequency bandwidth and/or limited storage capacity. These video coding standards include multiple coding stages such as intra prediction, transform from spatial domain to frequency domain, quantization, entropy coding, motion estimation, and motion compensation, in order to more effectively encode and decode frames.

The Joint Collaborative Team on Video Coding (JCT-VC) of the International Telecommunication Union Telecommunication Standardization Sector (ITU-T) Study Group 16 (SG16) Working Party 3 (WP3) and International Organization for Standardization/International Electrotechnical Commission (ISO/IEC) Joint Technical Committee 1/Subcommittee 29/Working Group 11 (JTC1/SC29/WG11) has launched a standardization effort for a video coding standard called the High Efficiency Video Coding standard (HEVC). Similar to some prior video coding standards, HEVC is block-based coding. An example of an HEVC encoder is shown in FIG. 1.

In HEVC, Context-Adaptive Binary Arithmetic Coding CABAC) is used to compress Transformed and Quantized Coefficients (TQCs) without loss. CABAC based encoding and/or decoding technique is generally context adaptive which refers to (i) adaptively coding symbols based on the values of previous symbols encoded and/or decoded in the past, and (ii) context, which identifies the set of symbols encoded and/or decoded in the past used for adaptation. The past symbols may be located in spatial and/or temporal adjacent blocks. In many cases, the context is based upon symbol values of neighboring blocks.

As mentioned above, CABAC may be used to compress TQCs without loss. By way of background, TQCs may be from different block sizes according to transform sizes (e.g., 4×4, 8×8, 16×16, 32×32). Two-dimensional (2D) TQCs may be converted into a one-dimensional (1D) array before entropy coding. In an example, 2D arrayed TQCs in a 4×4 block may be arranged as illustrated in Table (1).

TABLE (1)

| 4  | 0   | 1   | 0   |
|----|-----|-----|-----|
| 3  | 2   | -1  | ... |
| -3 | 0   | ... | ... |
| 0  | ... | ... | ... |

When converting the 2D TQCs into a 1D array, the block may be scanned in a diagonal zig-zag fashion. Continuing with the example, the 2D arrayed TQCs illustrated in Table (1) may be converted into 1D arrayed TQCs [4, 0, 3, -3, 2, 1, 0, -1, 0, . . . ] by scanning the first row and first column, first row and second column, second row and first column, third row and first column, second row and second column, first row and third column, first row and fourth column, second row and third column, third row and second column, fourth row and first column and so on.

The 1D array of TQCs is represented by a Syntax Element (SE) in CABAC. An example of an SE for the example 1D array of TCQs is shown in FIG. 2. The SE represents the following parameters for each Coefficient Level: Last position X/Y, Significance Map, and the attributes Greater than 1, Greater than 2, Sign Information, and Absolute -3.

In CABAC in HEVC, the representative SE is level coded. FIG. 3 shows the CABAC framework used for level coding an SE. The CABAC level coding technique includes coding symbols using stages. In the first stage, the CABAC uses a "binarizer" to map input symbols to a string of binary symbols, or "bins". The input symbol may be a non-binary valued symbol that is binarized or otherwise converted into a string of binary (1 or 0) symbols prior to being coded into bits. The bins can be level coded into bits using either a "bypass encoding engine" or a "regular encoding engine".

For the regular encoding engine in CABAC, in the second stage a probability model is selected. The probability model is used to arithmetic encode one or more bins of the binarized input symbols. This model may be selected from a list of available probability models depending on the context, which is a function of recently encoded symbols. The probability model stores the probability of a bin being "1" or "0". In the third stage, an arithmetic encoder encodes each bin according to the selected probability model. There are two sub-ranges for each bin, corresponding to a "0" and a "1". The fourth stage involves updating the probability model. The selected probability model is updated based on the actual encoded bin value (e.g., if the bin value was a "1", the frequency count of the "1"s is increased). The decoding technique for CABAC decoding reverses the process.

For the bypass encoding engine in CABAC, the second stage involves conversion of bins to bits omitting the computationally expensive context estimation and probability update stages. The bypass encoding engine assumes a fixed probability distribution for the input bins. The decoding technique for CABAC decoding reverses the process.

The CABAC encodes the symbols conceptually using two steps. In the first step, the CABAC performs a binarization of the input symbols to bins. In the second step, the CABAC performs a conversion of the bins to bits using either the bypass encoding engine or the regular encoding engine. The resulting encoded bit values are provided in the bitstream to a decoder.

The CABAC decodes the symbols conceptually using two steps. In the first step, the CABAC uses either the bypass decoding engine or the regular decoding engine to convert the input bits to bin values. In the second step, the CABAC performs de-binarization to recover the transmitted symbol value for the bin values. The recovered symbol may be non-binary in nature. The recovered symbol value is used in remaining aspects of the decoder.

As previously described, the encoding and/or decoding process of the CABAC includes at least two different modes of operation. In a first mode, the probability model is updated based upon the actual coded bin value, generally referred to as a "regular coding mode". The regular coding mode requires several sequential serial operations together with its associated computational complexity and significant time to complete. In a second mode, the probability model is not updated based upon the actual coded bin value, generally referred to as a "bypass coding mode". In the second mode, there is no probability model (other than perhaps a fixed probability) for decoding the bins, and accordingly there is no need to update the probability model.

When utilizing CABAC encoding in HEVC, throughput performance can differ depending on different factors such as but not limited to: total number of bins/pixels, number of bypass bins/pixels, and number of regular (or context) coded bins/pixels. Generally speaking, throughput for the case of high bit-rate encoding (low QP value) is significantly less than throughput in other cases. Therefore, throughput in high bit-rate cases may consume a significant amount of processing resources and/or may take a significant amount of time to encode/decode. The disclosure that follows solves this and other problems.

BRIEF DESCRIPTION OF THE DRAWINGS

FIG. 9 illustrates a mapping table that may be used for determining an input value in high throughput binarization mode.
FIG. 10 illustrates a plurality of binarization tables that may be used for adaptive binarization in high throughput binarization mode.

DETAILED DESCRIPTION

Figure 1:
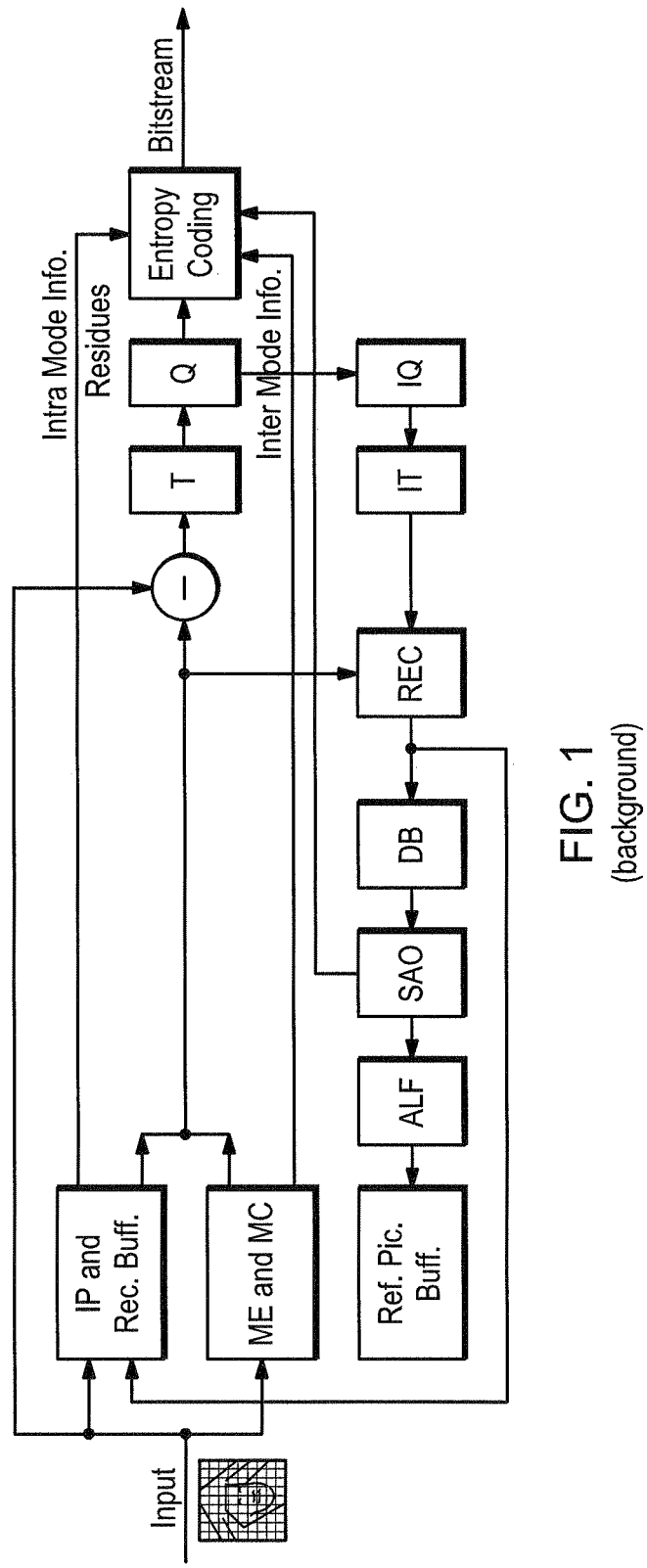
FIG. 1 is a block diagram of an HEVC encoder.
Figure 2:
FIG. 2 is a table showing a syntax element according to CABAC.
Figure 3:
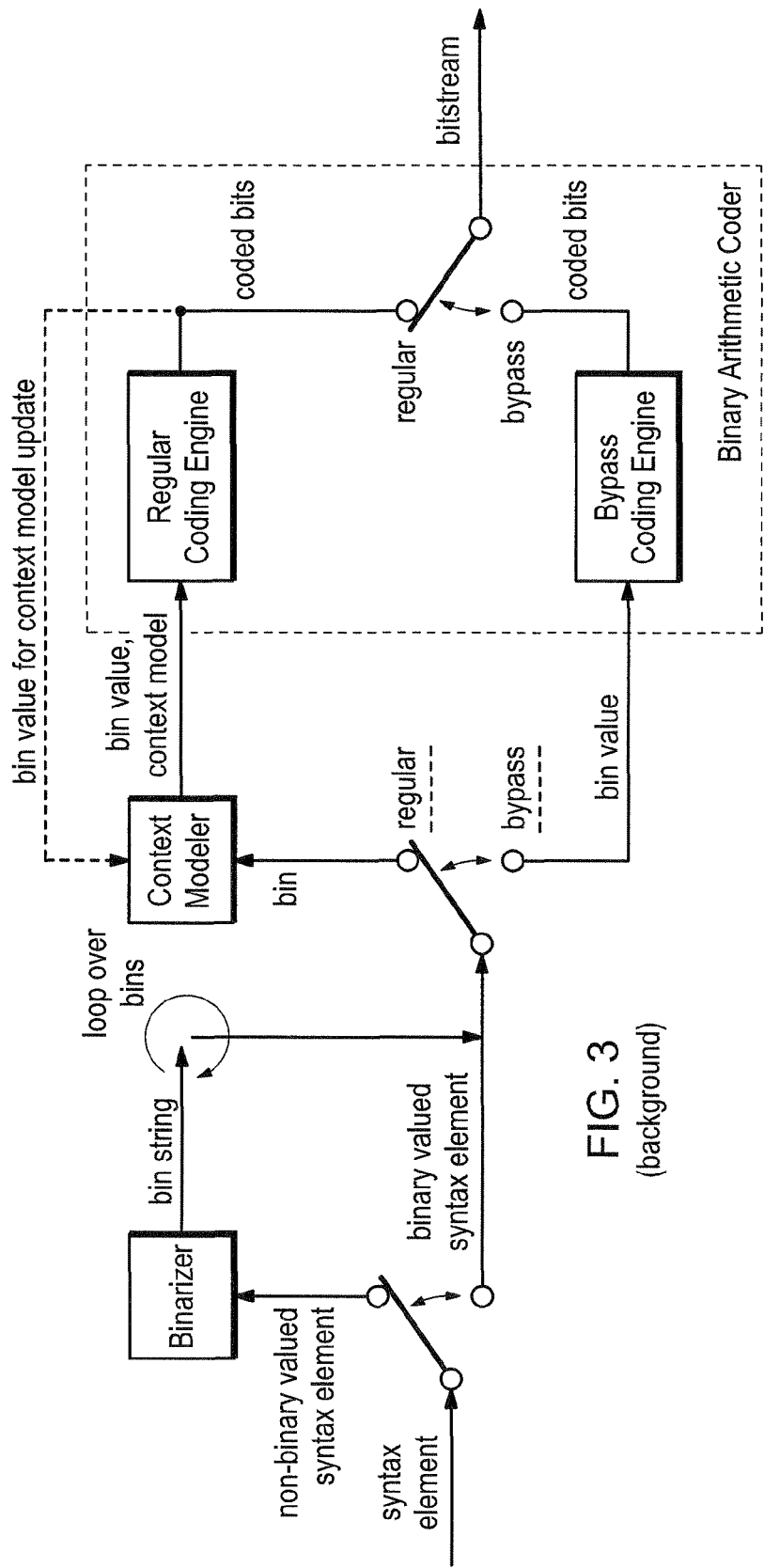
FIG. 3 is a block diagram of the CABAC framework for a syntax element.
Figure 4:
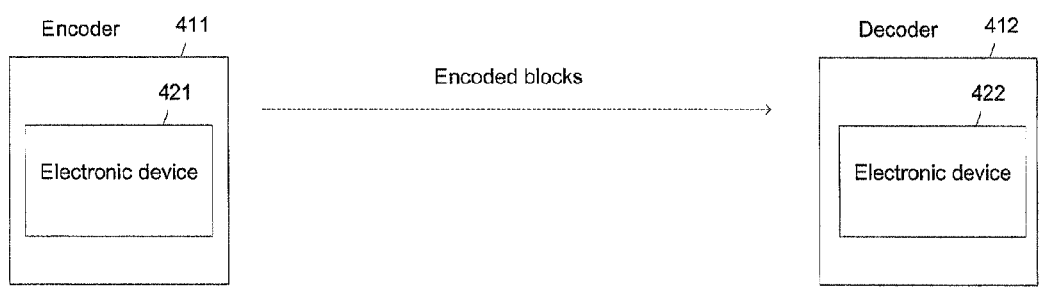
FIG. 4 is a block diagram illustrating an example of a coder and a decoder.

FIG. 4 is a block diagram illustrating an example of a coder and a decoder.
The system 400 includes an encoder 411 to generate encoded blocks to be decoded by a decoder 412. The encoder 411 and the decoder 412 may communicate over a network.

The encoder 411 includes an electronic device 421 configured to encode using high throughput binarization mode. The electronic device 421 may comprise a processor and memory in electronic communication with the processor, where the memory stores instructions being executable by the processor to perform the operations shown in FIGS. 5 and 6.

The decoder 412 includes an electronic device 422 configured to decode using the high throughput binarization mode. The electronic device 422 may comprise a processor and memory in electronic communication with the processor, where the memory stores instructions being executable to perform the operations shown in FIGS. 7 and 8.

Figure 5:
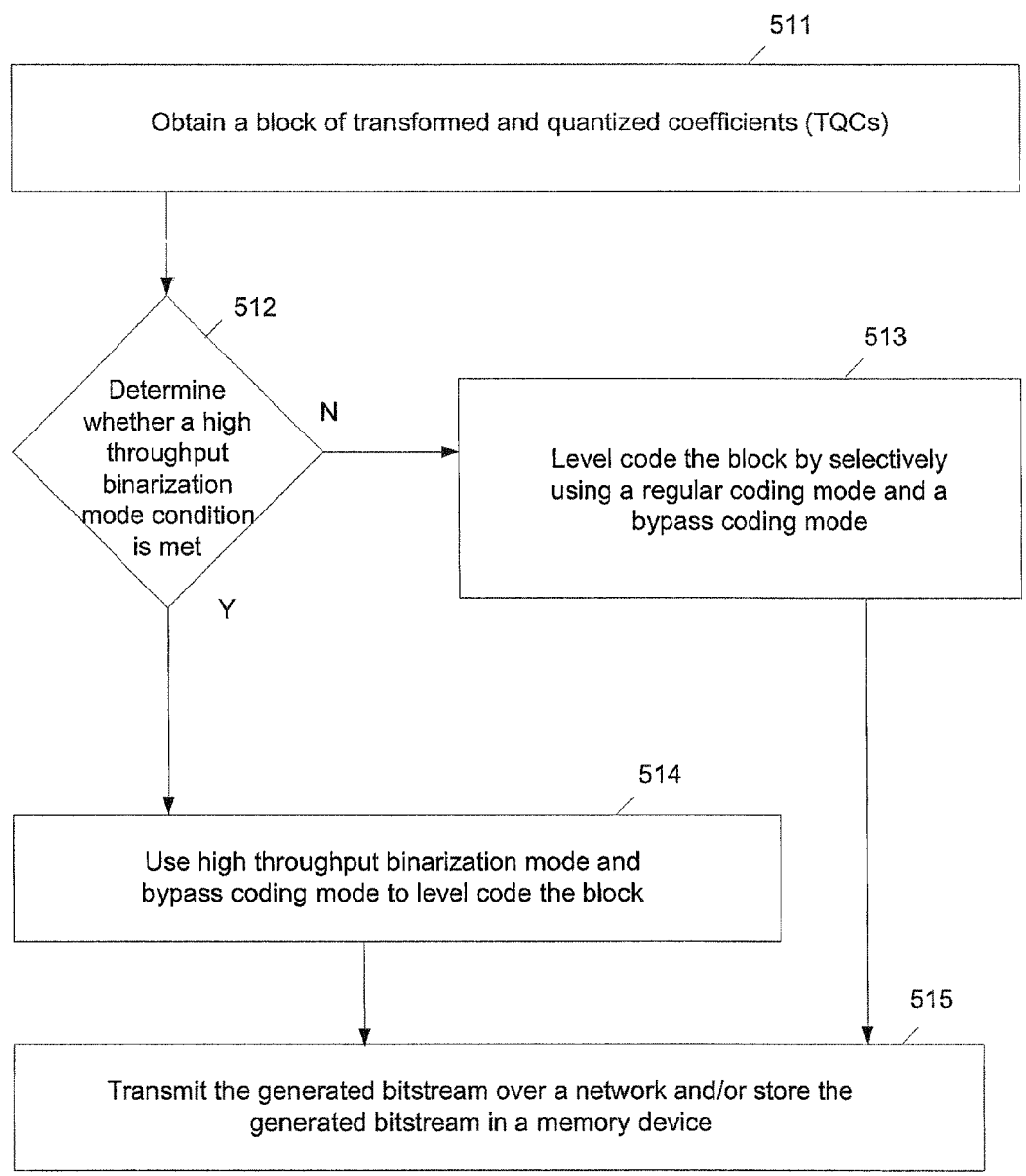
FIG. 5 is a flow diagram illustrating one configuration of a method for high throughput binarization mode on an electronic device.

FIG. 5 is a flow diagram illustrating one configuration of a method for high throughput binarization mode on an electronic device.

In block 511, the electronic device 421 obtains a block of transformed and quantized coefficients (TCQs). In diamond 512, the electronic device 421 determines whether a high throughput binarization mode condition is met. If the condition is not met in diamond 512, then in block 513 the electronic device 421 level codes the block by selectively using a regular coding mode and a bypass coding mode (according to conventional CABAC selection schemes).

If the condition is met in diamond 512, then in block 514 the electronic device 421 uses high throughput binarization mode and bypass coding mode to level code the block. The electronic device 421 transmits the generated bitstream over a network and/or stores the generated bitstream in a memory device in block 515.

HTB mode uses bypass coding mode for level coding. In contrast to regular encoding mode, bypass coding omits the computationally expensive context estimation and probability update stages because bypass coding mode assumes a fixed probability distribution for the input bins.

In addition to using bypass coding mode for level coding, by way of contrast to conventional CABAC, HTB mode uses simplified signing structure for level coding. For example, conventional CABAC requires four sub-parts for level coding, including Greater_than_1, Greater_than_2, Sign information, and Absolute −3.

Figure 6:
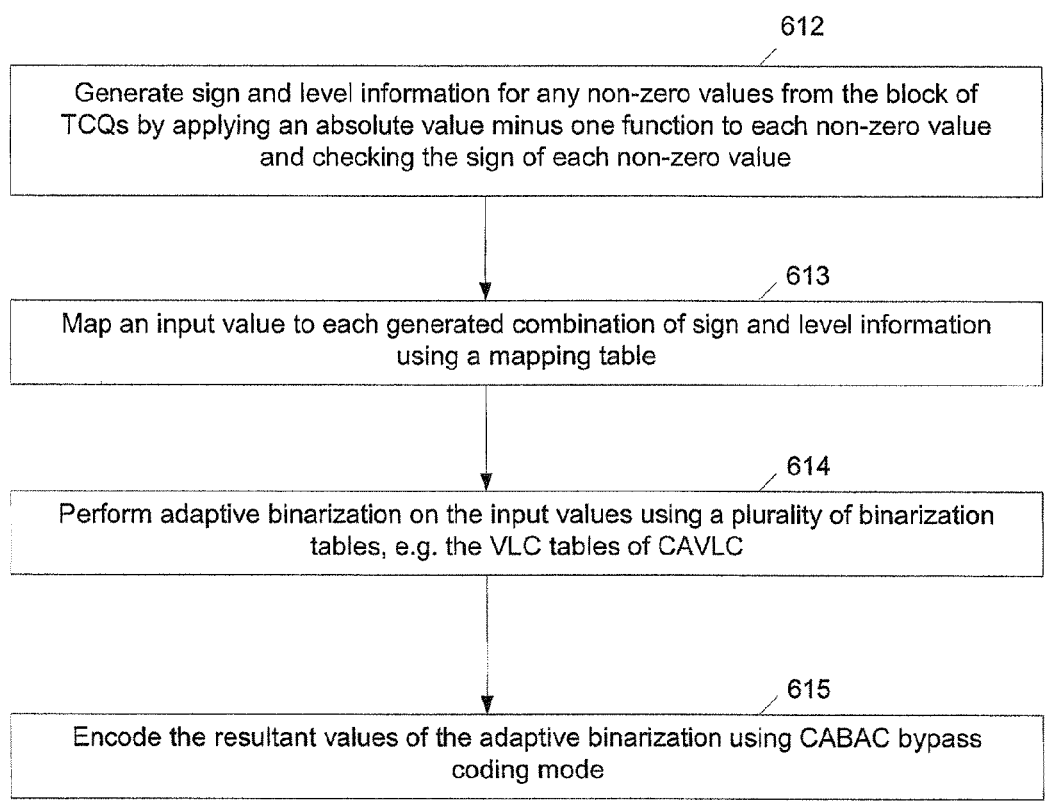
FIG. 6 is a flow diagram illustrating one configuration of encoder processing using high throughput binarization mode.

FIG. 6 is a flow diagram illustrating one configuration of encoder processing using high throughput binarization mode.

The blocks 612-615 illustrate operations performed in block 514 in more detail. In block 612, the electronic device 421 generates sign and level information for any non-zero values from the block of TCQs by applying an absolute value minus one function to each non-zero value and checking the sign of each non-zero value. For ease of explanation, consider the values for the 1D arrayed TQC from the background section of the present application [4, 0, 3, −3, 2, 1, 0, −1, 0, . . . ]. Applying the absolute value minus one function to each non-zero value and checking the sign of each non-zero value generates six combinations of sign and level information as follows: +3, +2, −2, +1, +0, and −0.

In block 613, the electronic device 421 maps an input value to each generated combination of sign and level information using a mapping table. An example mapping table is shown in FIG. 9. FIG. 9 also shows an equation for determining an input value according to blocks 612 and 613.

In block 614, the electronic device 421 performs adaptive binarization of the input values using a plurality of binarization tables, e.g. the VLC tables of Context Adaptive Variable Length Coding (CAVLC). An example of the VLC tables of CAVLC is shown in FIG. 10. FIG. 10 also shows an equation for updating the binarization tables based on previous input information.

In an example, block 614 may include initially using values from the column VLC-Table-0 (FIG. 10) to binarize at least the first input value. The VLC table number may be monotomically increased when a previous value is larger than the given threshold values, e.g. 3, 5, 13, 27. Accordingly, subsequent adaptive binarization after the first monotomical increase may use values from the column VLC-Table-1, subsequent adaptive binarization after the second monotomical increase may use values from the column VLC-Table-2, etc.

In block 615, the electronic device 421 encodes the resultant values of the adaptive binarization using the CABAC bypass coding mode.

High Throughput Binarization Mode Condition

In an example, if a characteristic corresponding to a block of image data is greater than a preset threshold, then the high throughput binarization mode condition is met, e.g. the electronic device 421 may set a high throughput binarization mode indicator, e.g. an HTB mode flag, to a value of 1 (which of course may include changing a default value of the HTB mode flag or leaving the HTB mode flag at a default value depending on design preference).

In an example, the electronic device 421 determines whether a bit rate for a coding is greater than a preset threshold. If the bit rate is greater than the preset threshold, then the high throughput binarization mode condition is met. In an example, the preset bit rate threshold corresponds to QP 16; however, a preset threshold corresponding to different QP values may be used.

In an example, the determination (by the electronic device 421) of whether the high throughput binarization mode condition is met is based on whether the transform unit level of a corresponding block of image data is greater than a preset threshold.

In an example, the determination (by the electronic device 421) of whether the high throughput binarization mode condition is met is based on whether the slice level of a corresponding block of image data is greater than a preset threshold.

High Throughput Binarization Mode Indicator

In an example, the electronic device 421 is configured to set a high throughput binarization indicator, e.g. an HTB mode flag, in a header, e.g. the slice header. The high throughput binarization indicator may be used to determine whether or not the process shown in FIG. 5 is executed for block(s) corresponding to the slice header.

In an example, setting the HTB mode flag to "1" causes the electronic device 421 to perform the process shown in the flowchart of FIG. 5 for block(s) corresponding to the slice header in response to observing the HTB mode flag value of "1". Setting the HTB mode flag to "0" causes the electronic device 421 to encode block(s) corresponding to the slice header according to a conventional CABAC technique in response to observing the HTB mode flag value of "0".

The HTB mode flag value may also be observed by the electronic device 422 for decoding. In an example, the electronic device 422 decodes block(s) corresponding to a slice header having the HTB mode flag value of "1" according to the process shown in the flowchart of FIG. 7 for block(s) corresponding to the slice header in response to observing the HTB mode flag value of "1". The electronic device 422 decodes block(s) corresponding to a slice header having the HTB mode flag value of "0" according to a conventional CABAC technique in response to observing the HTB mode flag value of "0".

Figure 7:
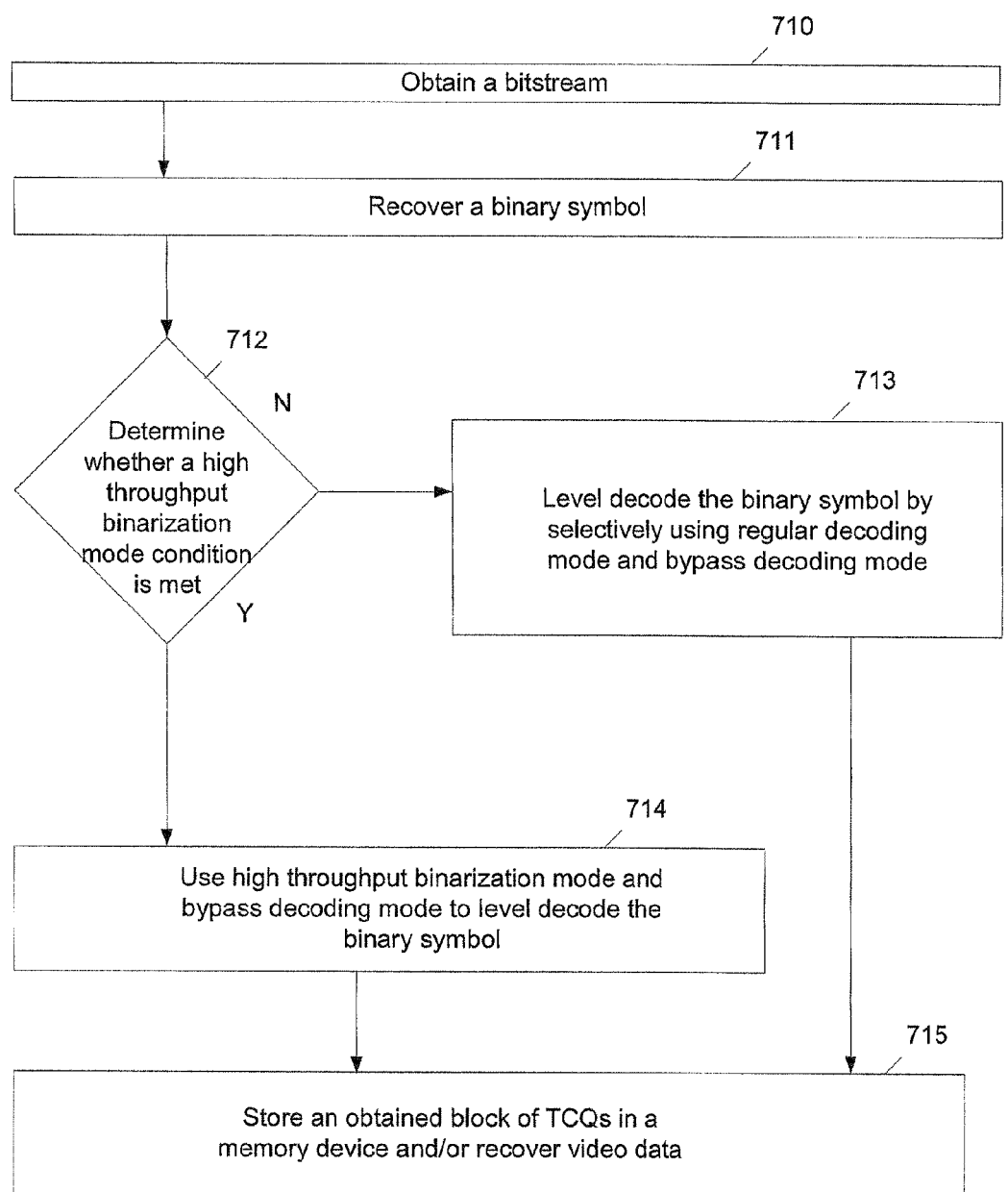
FIG. 7 is a flow diagram illustrating one configuration of a method for high throughput binarization mode on an electronic device at the decode-side.

FIG. 7 is a flow diagram illustrating one configuration of a method for high throughput binarization mode on an electronic device at the decode-side.

In block 710, the electronic device 422 obtains a bitstream. In block 711, the electronic device 422 recovers a binary symbol from the obtained bitstream.

In diamond 712, the electronic device 422 determines whether a high throughput binarization mode condition is met. In an example, the determination may include checking a header, such as a slice header, corresponding to the received bitstream. Checking the header may further comprise checking a slice header corresponding to the obtained bit stream for a value of a high throughput binarization mode indicator. If the condition is not met in diamond 712, then in block 713 the electronic device 422 level decodes the binary symbol by selectively using regular decoding mode and bypass coding mode.

If the condition is met in diamond 712, then in block 714 the electronic device 421 uses high throughput binarization mode and bypass decoding mode to level decode the binary symbol. The electronic device 422 may store an obtained block of TCQs in a memory device and/or may recover video data in block 715.

Figure 8:
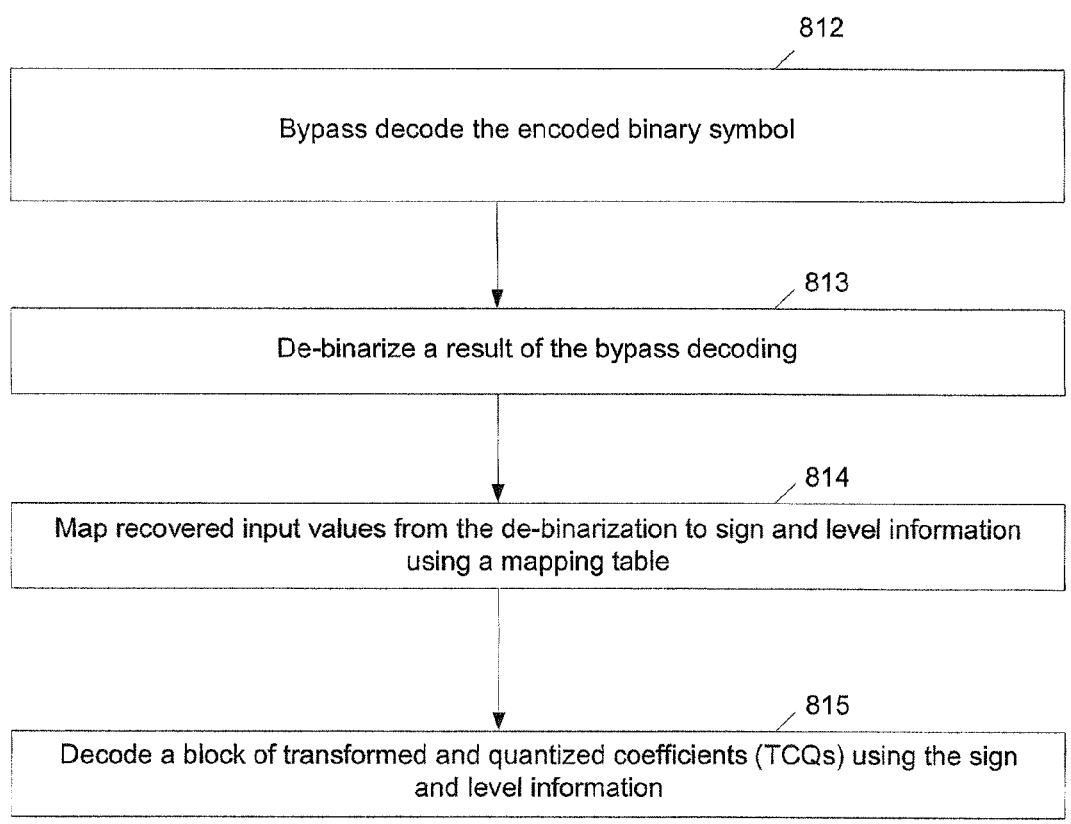
FIG. 8 is a flow diagram illustrating one configuration of decoder processing using high throughput binarization mode.

FIG. 8 is a flow diagram illustrating one configuration of decoder processing using high throughput binarization mode.

The blocks 812-815 illustrate operations performed in block 714 in more detail. In block 812, the electronic device 422 bypass decodes the encoded binary symbol. In block 813, the electronic device 422 de-binarizes a result of the bypass decoding. In block 814, the electronic device 422 maps recovered input values from the de-binarization to sign and level information using a mapping table. In block 815, the electronic device 422 decodes a block of transformed and quantized coefficients (TCQs) using the sign and level information.

In an example, an electronic device including a processor and a memory in electronic communication with the processor is provided. Stored in the memory are instructions executable by the processor to perform operations.

In an example, an operation may include obtaining a block of transformed and quantized coefficients (TCQs). Another operation may include determining whether a high throughput binarization mode condition is met. Another operation may include generating a first bitstream using the high throughput binarization mode in response to determining that the high throughput binarization mode condition is met. Another operation may include generating a second bitstream in response to determining that the high throughput binarization mode condition is not met. Another operation may include transmitting the generated first or second bitstream to a decoder.

In an example, the generation of the first bitstream using the high throughput binarization mode may include additional operations. One operation may include generating sign and level information for any non-zero values from the block by applying an absolute value minus one function to each non-zero value and checking the sign of each non-zero value. Another operation may include mapping an input value to each generated combination of sign and level information using a mapping table. Another operation may include performing adaptive binarization of the mapped input values using a plurality of binarization tables. Another operation may include encoding a result of the adaptive binarization.

In an example, the plurality of binarization tables include VLC tables of CAVLC. Encoding the result of the adaptive binarization may further include the operation of utilizing a CABAC bypassing coding mode.

In an example, the adaptive binarization of the mapped input values using a plurality of binarization tables may include additional operations. One operation may include determining whether one of the mapped input values is greater than a preset threshold. Another operation may include performing a table update responsive to determining that said mapped input value is greater than the preset threshold.

In an example, the generation of the first bitstream may include additional operations. One operation may include level coding the block by selectively utilizing a regular coding mode and a bypass coding mode according to CABAC. Another operation may include generating the first bitstream utilizing only the bypass coding mode.

In an example, the determination of whether the high throughput binarization mode condition is met is based on whether a characteristic corresponding to a block of image data is greater than a preset threshold.

In an example, the determination of whether the high throughput binarization mode condition is met is based on whether the slice level of a corresponding block of image data is greater than a preset threshold.

In an example, the determination of whether the high throughput binarization mode condition is met is based on whether the transform unit level of a corresponding block of image data is greater than a preset threshold.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. One or more of the operations, processes, and/or methods described herein may be performed by an apparatus, a device, and/or a system substantially similar to those as described herein and with reference to the illustrated figures.

A processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a conventional rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method for decoding a bit stream associated with transform coefficients comprising:
   obtaining a bit steam; and
   determining whether to decode level information of a 4×4 block of a block from the bit stream using: a high throughput binarization mode and a bypass decoding mode, or selectively using a regular decoding mode and the bypass decoding mode, based on a value of a high throughput binarizaiton mode indicator in a header that is contained in the bit stream and corresponding to the 4×4 block,
   in response to determining that the value of the high throughput binarizaiton mode indicator is a first value, decoding a binary symbol corresponding to the 4×4 block from the bit stream by using the bypass decoding mode, de-binarizing the bypass decoded binary symbol by using the high throughput binarizaiton mode to obtain an input value, and deriving a sign and level information of the 4×4 block by mapping the obtained input value using a mapping table predefined;
   in response to determining that the value of the high throughput binarizaiton mode indicator is a second value that is different from the first value, decoding level information of the 4×4 block from the bit steam by selectively using the regular decoding mode and the bypass decoding mode.

2. The method of claim 1, wherein the high throughput binarizaiton is selected from a group of binarization tables based on the obtained input value.

3. The method of claim 2, wherein the binarizaiton tables are Variable Length Coding (VLC) tables of Context Adaptive Variable Length Coding (CAVLC).

4. The method of claim 2, further comprising:
   determining whether the obtained input value is greater than a preset threshold; and
   updating the binarization tables responsive to determining that the obtained input value is greater than the preset threshold.

5. The method of claim 2, wherein, the header is slice header.

6. The method of claim 2, wherein, the value of the high throughput binarization mode indicator is set to the first value at an encoding side when:
   a characteristic corresponding to the 4×4 block is greater than a preset threshold; or
   the slice level of the 4×4 block is greater than a preset threshold; or
   the transform unit of the 4×4 block is greater than a preset threshold.

* * * * *